United States Patent
Feng et al.

(10) Patent No.: US 9,774,002 B2
(45) Date of Patent: Sep. 26, 2017

(54) COMPOSITE FILM AND METHOD FOR MANUFACTURING THE SAME, AND ORGANIC LIGHT-EMITTING DIODE AND METHOD FOR PACKAGING THE SAME

(71) Applicants: BOE TECHNOLOGY GROUP CO., LTD., Beijing (CN); ORDOS YUANSHENG OPTOELECTRONICS CO., LTD., Ordos (CN)

(72) Inventors: Xiang Feng, Beijing (CN); Jing Liu, Beijing (CN); Xiangdong Wei, Beijing (CN); Yun Qiu, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 36 days.

(21) Appl. No.: 15/137,571

(22) Filed: Apr. 25, 2016

(65) Prior Publication Data
US 2017/0018734 A1    Jan. 19, 2017

(30) Foreign Application Priority Data
Jul. 17, 2015   (CN) .......................... 2015 1 0424275

(51) Int. Cl.
*H01L 51/52*   (2006.01)
*H01L 27/32*   (2006.01)
(Continued)

(52) U.S. Cl.
CPC ........ *H01L 51/5253* (2013.01); *B29C 41/006* (2013.01); *C08G 63/916* (2013.01);
(Continued)

(58) Field of Classification Search
None
See application file for complete search history.

(56) References Cited

U.S. PATENT DOCUMENTS

| 2004/0183069 A1 | 9/2004 | Afzali-Ardakani et al. |
| 2010/0173134 A1* | 7/2010 | Khokhlov ............. H01L 51/442 428/174 |

(Continued)

FOREIGN PATENT DOCUMENTS

| CN | 1761532 A | 4/2006 |
| CN | 103682054 A | 3/2014 |
| WO | WO-2013100675 A1 | 7/2013 |

OTHER PUBLICATIONS

First Office Action regarding Chinese Application No. 201510424275.2, dated Aug. 3, 2016. Translation provided by Dragon Intellectual Property Law Firm.
(Continued)

*Primary Examiner* — Joseph Schoenholtz
(74) *Attorney, Agent, or Firm* — Harness, Dickey & Pierce, P.L.C.

(57) ABSTRACT

The present disclosure discloses a composite film and a method for manufacturing the same, and an organic light-emitting diode and a method for packaging the same. The composite film comprises: a base membrane; a PDDA layer, which is deposited on a first surface of the base membrane; a graphite oxide layer, which is deposited on the PDDA layer; a monomolecular layer, which is self-assembled on a surface of the graphite oxide layer and is composed of a compound of Formula I. The method for manufacturing the composite film comprises a self-assembling step which includes placing and soaking a base membrane deposited with a graphite oxide layer in a solution of a compound of Formula I, and self-assembling the compound of Formula I on the graphite oxide layer.
(Continued)

Formula I

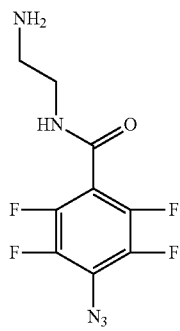

20 Claims, 8 Drawing Sheets

(51) Int. Cl.
*H01L 51/56* (2006.01)
*B29C 41/00* (2006.01)
*C08G 63/91* (2006.01)

(52) U.S. Cl.
CPC ........ *H01L 27/323* (2013.01); *H01L 51/5256* (2013.01); *H01L 51/56* (2013.01); *H01L 2251/303* (2013.01)

(56) References Cited

U.S. PATENT DOCUMENTS

2014/0212659 A1* 7/2014 Dai .................. B32B 9/007
428/336
2014/0242354 A1 8/2014 Ro et al.

OTHER PUBLICATIONS

Liu, Li-Hong et al., "A Simple Method for the Covalent Immobilization of Graphene", NIH-PA Author Manuscript, Nano Lett. Sep. 2009; 9(9): 3375-3378.
Yoon, Taeshik et al., "Direct Measurement of Adhesion Energy of Monolayer Graphene As-Grown on Copper and Its Application to Renewable Transfer Process", Nano Lett. 2012 pp. 1-7.
Lock, Evgeniya H., et al., "High-Quality Uniform Dry Transfer of Graphene to Polymers", Nano Lett. 2012, 12, 102-107.
Liu, Li et al., "Surface and Interface Control on Photochemically Initiated Immobilization", NIH-PA Author Manuscript, J Am Chem. Soc. Author Manuscript, Sep. 27, 2008, pp. 1-17.
Jeon, Jin-Nam et al., "Ultra-thin Flexible Encapsulation Layer for OLED Displays using Graphene Oxide Nanocomposite", SID 2013 Digest, pp. 1449-1452.

* cited by examiner

COMPOSITE FILM AND METHOD FOR MANUFACTURING THE SAME, AND ORGANIC LIGHT-EMITTING DIODE AND METHOD FOR PACKAGING THE SAME

CROSS-REFERENCE TO RELATED APPLICATION

This application claims priority to Chinese Patent Application No. 201510424275.2 filed on Jul. 17, 2015, the disclosure of which is incorporated in its entirety by reference herein.

TECHNICAL FIELD

The present disclosure relates to the field of organic light-emitting diode packaging, in particular to a composite film and a method for manufacturing the same, and an organic light-emitting diode and a method for packaging the same.

BACKGROUND

Water and oxygen are natural enemies of an organic light-emitting diode, which not only can break an unsaturated bond of a polymer and thus accelerate the aging of the organic material therein, but also can harm the electrode in the organic light-emitting diode. Therefore, the packaging level of the organic light-emitting diode determines the life time thereof and the reliance on environment.

Ultraviolet packaging is a common packaging method employed in the laboratory. It has the advantages of low cost and simple operation, but the ultraviolet glue will contact the organic light-emitting diode during the curing of the ultraviolet glue and have an adverse effect on the organic light-emitting diode. Therefore, it cannot be used for the practical industry.

Frit packaging is a packaging method for connecting a packaging glass and a backing substrate by curing the glass frit. However, in this method, crazing may occur during the curing of the glass frit, and air may enter the organic light-emitting diode from the cracks, thus the life time thereof may be influenced.

Comparing with the above method, the traditional film packaging method may be applied to practical industry, and no air will enter the organic light-emitting diode. However, in the traditional film packaging method, an organic light-emitting diode must be prepared first, and then a film is deposited on the organic light-emitting diode for packaging; the organic light-emitting diode and the film cannot be prepared separately and then packaged, thus the preparation process is complex and the production cost is high.

Therefore, it is desired to provide a composite film which can be prepare separately and be used for packaging an organic light-emitting diode, and a packaging method of the composite film.

SUMMARY

The present disclosure provides a film and a method for manufacturing the same, and organic light-emitting diode and a method for manufacturing the same, thereby solving the problem of the prior art that that an organic light-emitting diode and a film cannot be prepared separately.

One embodiment of the present disclosure provides a composite film, which includes:

a base membrane;

a PDDA (phthalic diglycol diacrylate) layer, which is deposited on a first surface of the base membrane;

a graphite oxide layer, which is deposited on the PDDA layer;

a monomolecular layer, which is self-assembled on a surface of the graphite oxide layer and is composed of a compound of Formula I

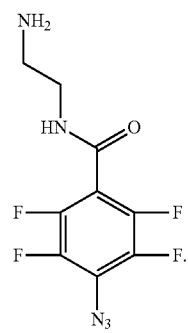

Formula I

In one example of the composite film according to the present disclosure, the monomolecular layer is connected with the graphite oxide layer via a hydrogen bond.

In one example of the composite film according to the present disclosure, the hydrogen bond is generated by —$NH_2$ in the compound of Formula I and —COOH and/or —OH on the surface of the graphite oxide layer.

In one example of the composite film according to the present disclosure, the base membrane is a polyethylene terephthalate (PET) membrane.

In one example of the composite film according to the present disclosure, the composite film includes at least three PDDA layers and at least three graphite oxide layers; wherein the PDDA layers and the graphite oxide layers are deposited alternately, with the graphite oxide layer as a layer deposited last.

In one example of the composite film according to the present disclosure, a second surface of the base membrane is provided with an emitting electrode and a receiving electrode that are configured for a touch screen.

Another embodiment of the present disclosure provides a method for manufacturing a composite film, which includes a self-assembling step: placing and soaking a base membrane deposited with a graphite oxide layer in a solution of a compound of Formula I, and self-assembling the compound of Formula I on the graphite oxide layer;

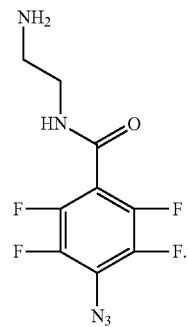

Formula I

In one example of the manufacturing method according to the present disclosure, the solution of the compound of Formula I is a methanol solution with a concentration of 3~5 mg/ml.

In one example of the manufacturing method according to the present disclosure, the soaking time is 90~150 min.

In one example of the manufacturing method according to the present disclosure, the base membrane deposited with the graphite oxide layer is manufactured by a base membrane pretreatment step and an electrostatic deposition step.

In one example of the manufacturing method according to the present disclosure, the base membrane pretreatment step includes: irradiating a first surface of the base membrane with oxygen plasma, and generating negative oxygen ions on a first surface of the base membrane.

In one example of the manufacturing method according to the present disclosure, the electrostatic deposition step includes:

placing a pretreated base membrane in a PDDA electrolyte solution for deposition, and then placing it in a graphite oxide dispersion for deposition;

repeating the above deposition operations, until at least three PDDA layers and three graphite oxide layers are deposited on the base membrane, with the graphite oxide layer as a layer deposited last.

In one example of the manufacturing method according to the present disclosure, the method includes an electrode preparation step before the base membrane pretreatment step, the electrode preparation step includes preparing, on a second surface of the base membrane, an emitting electrode and a receiving electrode that are configured for a touch screen.

Another embodiment of the present disclosure provides an organic light-emitting diode, which is packaged by the composite film according to the present disclosure.

In one example of the organic light-emitting diode according to the present disclosure, a layer of polymer is deposited on a surface of the organic light-emitting diode before packaging.

In one example of the organic light-emitting diode according to the present disclosure, the polymer contains an active hydrogen atom which forms a covalent bond with —$N_3$ of the compound of Formula I of the composite film according to the present disclosure.

Another embodiment of the present disclosure provides a method for packaging an organic light-emitting diode, which includes:

a polymer deposition step which includes depositing a layer of polymer containing an active hydrogen atom on a surface of an organic light-emitting diode;

a packaging step which includes laminating the composite film according to the present disclosure and the organic light-emitting diode, and activating the —$N_3$ group in the compound of Formula I to form a covalent bond between the —$N_3$ group and the active hydrogen atom, thereby realizing packaging.

In one example of the packaging method according to the present disclosure, the —$N_3$ group in the compound of Formula I is activated by stamping, heating and ultraviolet irradiation.

Another embodiment of the present disclosure provides a method for packaging an organic light-emitting diode, which includes:

a polymer deposition step which includes depositing a layer of polymer containing an active hydrogen atom on a surface of an organic light-emitting diode;

a packaging step which includes preparing a composite film using the method for manufacturing a composite film according to the present disclosure, laminating the composite film and the organic light-emitting diode, and activating the —$N_3$ group in the compound of Formula I to form a covalent bond between the —$N_3$ group and the active hydrogen atom, thereby realizing packaging.

In one example of the packaging method according to the present disclosure, the —$N_3$ group in the compound of Formula I is activated by stamping, heating and ultraviolet irradiation.

The present disclosure has the beneficial effects below.

For the composite film obtained by the manufacturing method according to the present disclosure, it may form a covalent bond with a polymer layer containing an active hydrogen atom, thus chemical connection may be realized and the packaging will be firmer; by employing the composite film of the present disclosure and the method of the present disclosure, the preparation of the film and the preparation of the light-emitting diode may be separately performed, and the production process may be simplified. Moreover, the water and oxygen blocking effect after the packaging is good, and the transmittance of the film can be above 90%.

DETAILED DESCRIPTION

The specific embodiments below are only used for illustrating the present disclosure, rather than limiting the present disclosure. The present disclosure will be further illustrated and described in detail below in conjunction with the drawings and specific embodiments.

The composite film according to the present disclosure includes: a base membrane; a PDDA layer, which is deposited on a first surface of the base membrane; a graphite oxide layer, which is deposited on the PDDA layer; a monomolecular layer, which is self-assembled on a surface of the graphite oxide layer and is composed of a compound of Formula I,

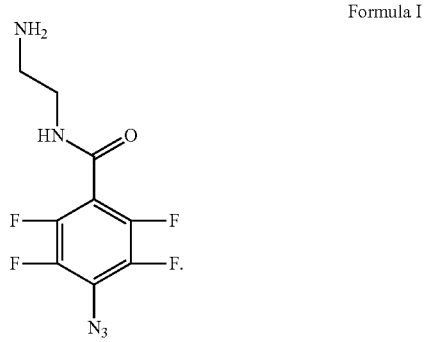 [SMILES: [N-]=[N+]=Nc1c(F)c(F)c(C(=O)NCCN)c(F)c1F]

Formula I

In the monomolecular layer of the composite film according to the present disclosure, the —$N_3$ group in the compound of Formula I may form a covalent bond with an active hydrogen atom in a polymer, thus it may be chemically connected with a polymer containing the active hydrogen atom. Therefore, the composite film of the present disclosure may be configured for packaging an organic light-emitting diode deposited with a polymer containing an active hydrogen atom.

According to one embodiment of the present disclosure, the monomolecular layer is connected with the graphite oxide layer via a hydrogen bond.

According to one embodiment of the composite film according to the present disclosure, the bonding of the monomolecular layer and the graphite oxide layer is made firmer by the hydrogen bond.

According to one embodiment of composite film of the present disclosure, the hydrogen bond is generated by —$NH_2$ in the compound of Formula I and —COOH and/or —OH on the surface of the graphite oxide layer.

According to one embodiment of the present disclosure, the bonding force of a hydrogen bond generated by connecting —$NH_2$ with —COOH and/or —OH on the surface of the graphite oxide layer is firmer.

According to one embodiment of composite film of the present disclosure, the base membrane is a PET membrane.

According to one embodiment of composite film of the present disclosure, the base membrane is preferably a polyethylene terephthalate (PET) film, or a polyethylene naphthalate (PEN) film and a polyimide (PI) film may be employed; PDDA and graphite oxide may be deposited on the base membrane employed.

According to one embodiment of composite film of the present disclosure, the composite film includes at least three PDDA layers and at least three graphite oxide layers, the PDDA layers and the graphite oxide layers are deposited alternately, with the graphite oxide layer as a layer deposited last.

Figure 1:
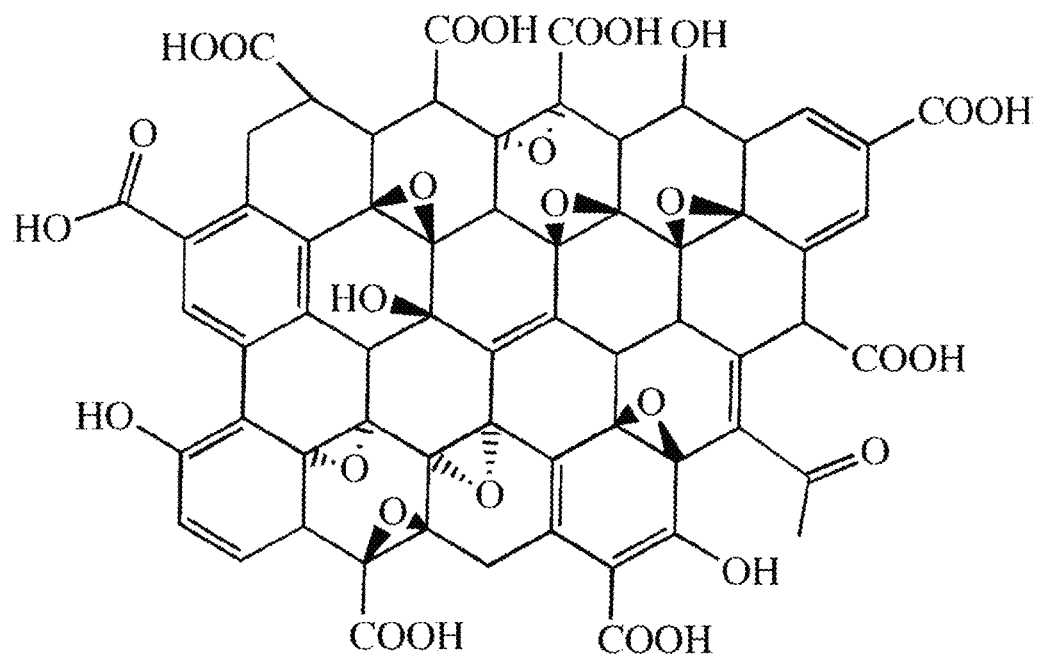
FIG. 1 shows the molecular structure of graphite oxide.

Since graphite has good water and oxygen resistance, graphite is employed as the packaging material in a traditional method. However, the preparation, processing and transferring processes of graphite are complex, thus it is not applicable for large-scale application, say nothing of industrialized production. In the present disclosure, graphite oxide is employed as the packaging material, which is easy to prepare and process and thus is applicable for industrialized production; however, it could be seen from the structural representation of a microfraction of graphite oxide in FIG. 1 that, although the main body of graphite oxide remains the annular structure of graphite, a water molecule and an oxygen molecule may penetrate therethrough due to the existence of a branched chain, a side chain and a surface group, thus the water and oxygen resistance of graphite oxide will be decreased. In the present disclosure, multiple layers of graphite oxide are deposited, so that graphite oxide layers are laminated and the pores formed by the branched chains and side chains of graphite are closed, thus the water and oxygen resistance of the film may be improved. According to one embodiment of the present disclosure, at least three graphite oxide layers are deposited on the composite film via electrostatic deposition to reinforce the water and oxygen resistance.

According to one embodiment of composite film of the present disclosure, a second surface of the base membrane is provided with an emitting electrode and a receiving electrode that are configured for a touch screen.

According to one embodiment of the composite film according to the present disclosure, the second surface of the base membrane is provided with an emitting electrode and a receiving electrode that are configured for a touch screen, therefore, the first surface of the composite film may be configured for packaging a light-emitting diode, and the second surface may be configured for preparing a touch screen.

According to another embodiment of the present disclosure, there provides a method for manufacturing a composite film, which includes a self-assembling step, the self-assembling step includes placing and soaking a base membrane deposited with a graphite oxide layer in a solution of a compound of Formula I, and self-assembling the compound of Formula I on the graphite oxide layer.

Figure 4:
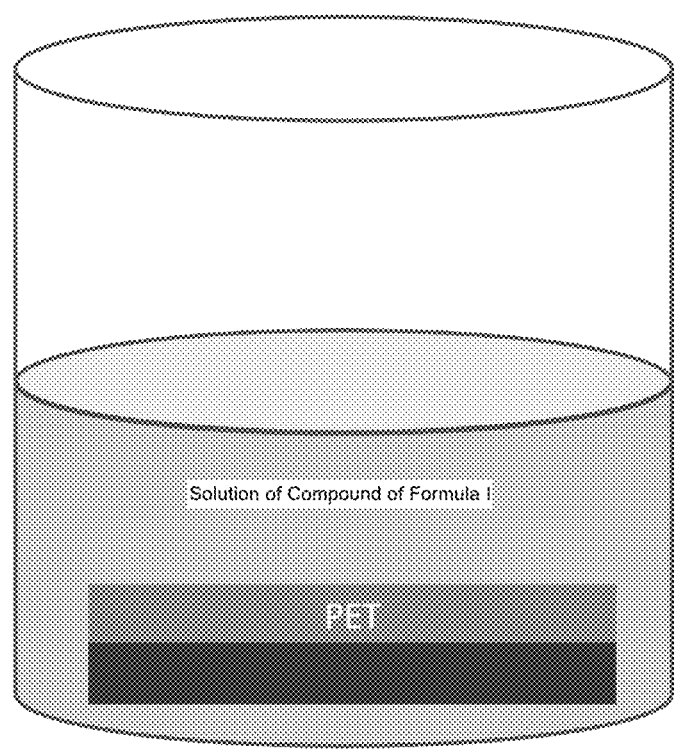
FIG. 4 is a schematic diagram showing a self-assembling step according to one embodiment of the present disclosure.

According to the self-assembling step of the composite film of the present disclosure shown in FIG. 4, a base membrane deposited with a graphite oxide layer is placed and soaked in a solution of a compound of Formula I, and the compound of Formula I is self-assembled on the graphite oxide layer, wherein a hydrogen bond is formed between the compound of Formula I and the graphite oxide, thus the compound of Formula I and the graphite oxide are chemically connected via the hydrogen bond, and azido groups pervades the surface of the monomolecular layer and may form covalent bonds with active hydrogen atoms. The self-assembled composite film is then taken out of the solution and soaked in methanol for 10 minutes so as to dissolve the excessive monomolecular layer on the composite film, then the composite film is dried by blowing with nitrogen gas and stored in dark place.

According to one embodiment of the manufacturing method of the present disclosure, the solution of the compound of Formula I is a methanol solution with a concentration of 3~5 mg/ml.

According to the embodiment of the manufacturing method of the present disclosure, when the concentration of the solution of the compound of Formula I is higher than 5 mg/ml, a multimolecular layer tends to be prepared; when the concentration is lower than 3 mg/ml, it is difficult for the compound of Formula I to be assembled.

According to one embodiment of the manufacturing method of the present disclosure, the soaking time is 90~150 min.

According to the embodiment of the manufacturing method of the present disclosure, when the soaking time is less than 90 min, it is difficult for the compound of Formula I to be assembled; when the soaking time is greater than 150 min, physical connection, rather than chemical connection, will occur between the compound of Formula I and the graphite oxide.

According to one embodiment of the manufacturing method of the present disclosure, a base membrane deposited with a graphite oxide layer is manufactured by a base membrane pretreatment step and an electrostatic deposition step.

According to one embodiment of the manufacturing method of the present disclosure, the base membrane pretreatment step includes irradiating a first surface of the base membrane via oxygen plasma.

Figure 2:
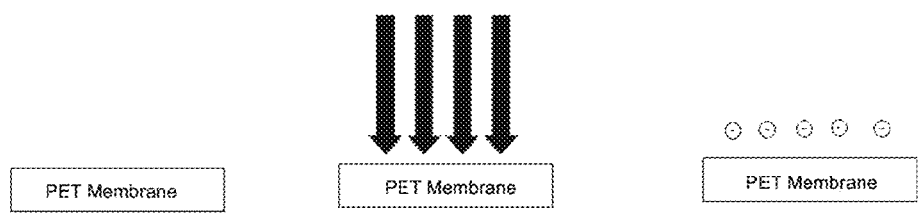
FIG. 2 is a schematic diagram showing a PET membrane pretreatment step according to one embodiment of the present disclosure.

As shown in FIG. 2, in the base membrane pretreatment step, the base membrane is irradiated with oxygen plasma to form negative oxygen ions. According to one embodiment of the manufacturing method of the present disclosure, in the pretreatment step, a PET membrane is cleaned by a traditional substrate cleaning method (cleaning by acetone, methanol and deionized water) and then the surface of the PET membrane is irradiated with oxygen plasma for 1 min to generate negative oxygen ions on the surface of the PET membrane. Therefore, a compound carrying positive charges may be deposited in the electrostatic deposition step.

According to one embodiment of the manufacturing method of the present disclosure, the electrostatic deposition step includes:

placing a pretreated base membrane in a PDDA electrolyte solution for deposition, and then placing it in a graphite oxide dispersion for deposition;

repeating the above deposition operations, until at least three PDDA layers and three graphite oxide layers are deposited on the base membrane, with the graphite oxide layer as a layer deposited last.

Figure 3:
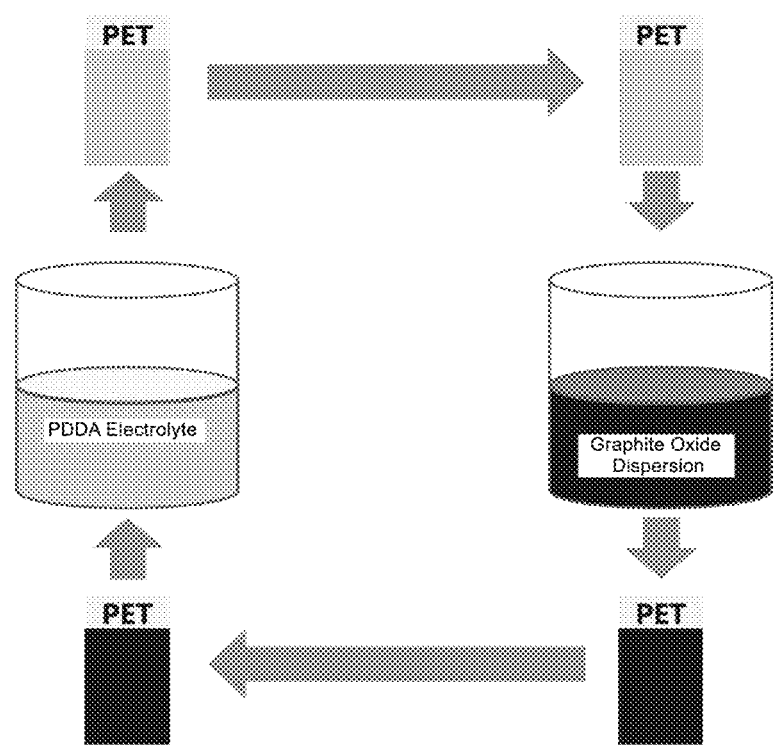
FIG. 3 is a schematic diagram showing an electrostatic deposition step according to one embodiment of the present disclosure.

According to the embodiment of the manufacturing method of the present disclosure, PDDA and graphite oxide are circularly deposited on the base membrane in turn; by depositing multiple layers of graphite oxide, the water and oxygen resistance of the graphite oxide layer may be reinforced. According to the schematic diagram of the electrostatic deposition step as shown in FIG. 3, first of all, a PET membrane after being irradiated by oxygen plasma is soaked in an electrolyte solution of PDDA for electrostatic attraction, wherein the concentration of the electrolyte solution of PDDA is preferably 5 mg/mL, the PDDA shows electropositivity after being ionized in water, and negative oxygen ions exist on the surface of the PET membrane after being treated with oxygen plasma, therefore, a PDDA layer which is very thin may be deposited on the surface of the PET membrane; the PET membrane prepared with the PDDA layer is take out of the PDDA electrolyte solution, dried by blowing with nitrogen gas and then placed into a graphite oxide dispersion, wherein the solvent of the graphite oxide dispersion is a mixed solvent of water and methanol, and the concentration of the graphite oxide dispersion is 0.2 mg/mL. In the dispersed graphite oxide, the carboxyl group is ionized to exhibit electronegativity, and the PDDA film exhibits electropositivity, therefore, a layer of graphite oxide layer may be formed on the surface of the PDDA layer via electrostatic attraction. Moreover, because of the electrification performance of the PDDA electrolyte solution and the graphite dispersion, deposition may be carried out for multiple times, so that the water and oxygen resistance of the graphite oxide layer may be improved; however, in order to deposit a monomolecular layer thereon, with the graphite oxide layer as a layer deposited last.

According to one embodiment of the manufacturing method of the present disclosure, the method includes an electrode preparation step before the base membrane pretreatment step, the electrode preparation step includes preparing, on a second surface of the base membrane, an emitting electrode and a receiving electrode that are configured for a touch screen.

According to the embodiment of the manufacturing method of the present disclosure, the second surface may be configured for a touch display screen; therefore, the touch display screen and the package may be integrated.

According to another embodiment of the present disclosure, there provides an organic light-emitting diode, which is packaged by the composite film according to the present disclosure.

According to one embodiment of the organic light-emitting diode of the present disclosure, the light-emitting diode device is packaged by the composite film of the present disclosure, no inorganic material is employed, and the transmittance is above 90%. The composite film and the organic light-emitting diode may be prepared separately, and the process is simple.

According to one embodiment of the organic light-emitting diode of the present disclosure, a layer of polymer is deposited on the surface of the organic light-emitting diode before packaging.

According to one embodiment of the organic light-emitting diode of the present disclosure, the layer of polymer is deposited for forming a covalent bond with the monomolecular layer of the composite film so as to realize chemical connection.

According to one embodiment of the organic light-emitting diode of the present disclosure, the polymer contains an active hydrogen atom, which forms a covalent bond with $-N_3$ of the compound of Formula I of the composite film of the present disclosure.

Figure 5:
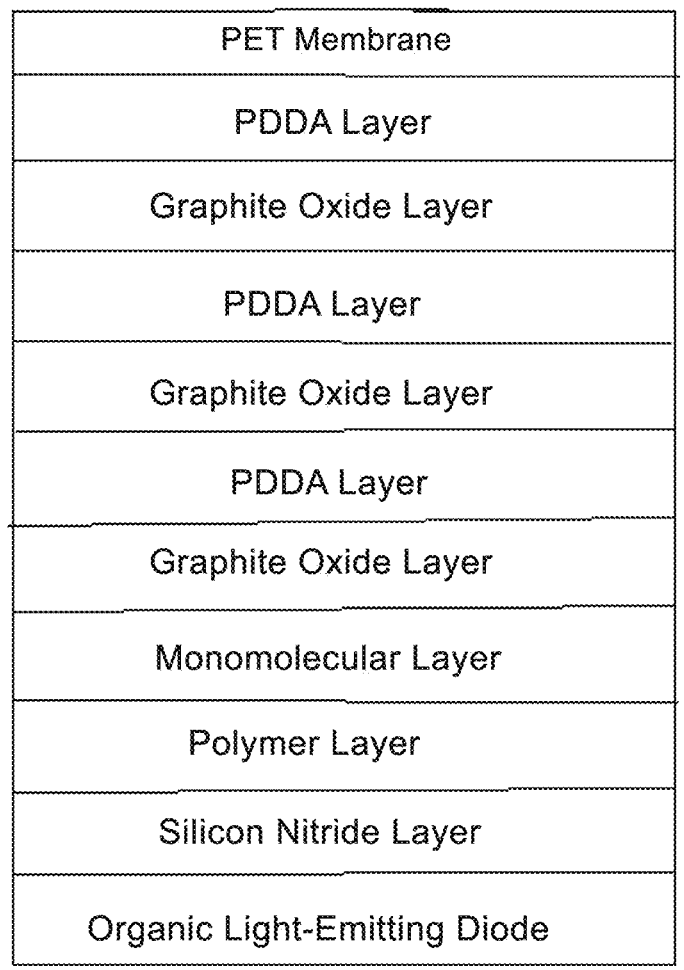
FIG. 5 is a schematic diagram of an organic light-emitting diode after being packaged according to one embodiment of the present disclosure.
Figure 6:
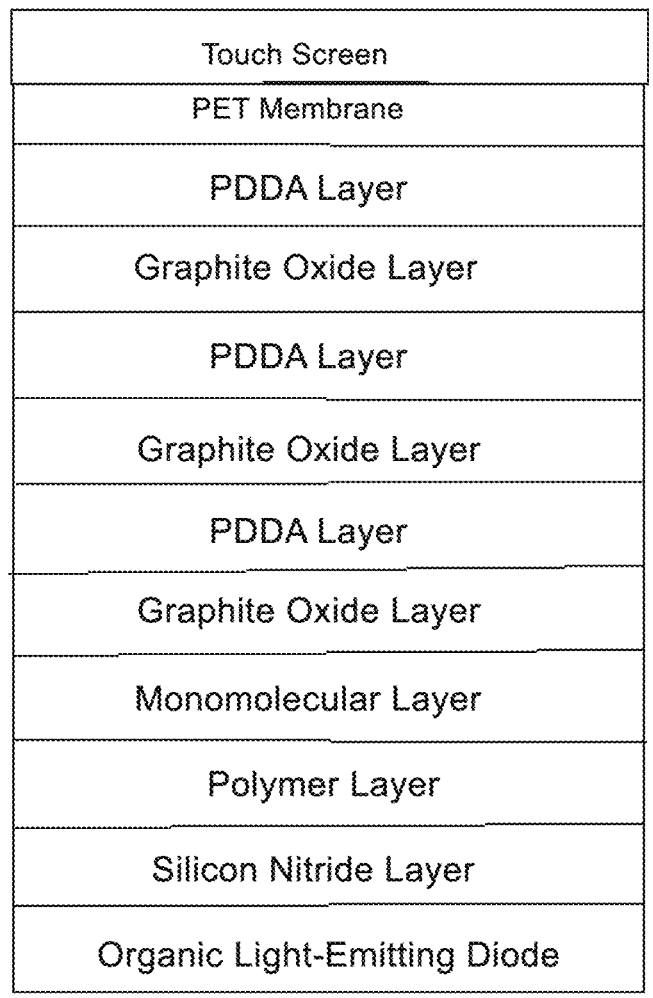
FIG. 6 is a schematic diagram of an organic light-emitting diode after being packaged according to one embodiment of the present disclosure.
Figure 7:
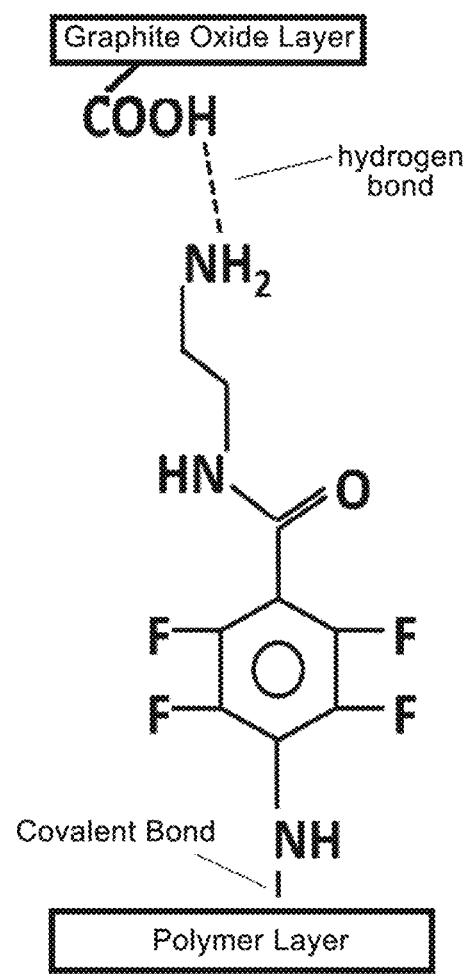
FIG. 7 is schematic diagram showing the packaging principle of the packaging method according to the present disclosure.

It may be seen from the organic light-emitting diode shown in FIG. 5 that, the organic light-emitting diode is packaged by the composite film according to one embodiment of the present disclosure. According to the organic light-emitting diode of the present disclosure shown in FIG. 6, after it is packaged by employing the film according to the present disclosure, the organic light-emitting diode is further arranged with a touch display screen thereon after being packaged. It may be seen from the packaging principle of the organic light-emitting diode according to the present disclosure shown in FIG. 7 that, the compound of Formula I of the monomolecular layer is connected with the graphite oxide via a hydrogen bond, and the compound of Formula I of the monomolecular layer is connected with the polymer containing an active hydrogen atom via a covalent bond, so that packaging is realized, moreover, the water and oxygen resistance after the packaging is improved greatly, and the transmittance after the packaging is also above 90%. When the polymer containing an active hydrogen atom is deposited via low-temperature plasma-enhanced chemical vapor deposition (PECVD), a silicon-containing polymer is employed; when the polymer containing an active hydrogen atom is deposited via ink-jet printing (IJP), an acrylic polymer is employed; the thickness of the polymer layer deposited is 1~5 μm, and preferably 3 μm.

According to another embodiment of the present disclosure, a method for packaging an organic light-emitting diode includes:

a polymer deposition step which includes depositing, on the surface of a light-emitting diode, a layer of polymer containing an active hydrogen atom;

a packaging step which includes laminating the composite film of the present disclosure and the organic light-emitting diode, activating the —$N_3$ group in a compound of Formula I to form a covalent bond between the —$N_3$ group and the active hydrogen atom, thereby realizing the packaging.

According to one embodiment of the packaging method of the present disclosure, —$N_3$ is activated and then forms covalent bond with active hydrogen, so that the polymer and the composite film are bonded. The preparation of the film and the organic light-emitting diode are separately performed, so that the number of times of evaporation may be reduced, and it is only required to form a layer of polymer material on the outer surface after the organic light-emitting diode is prepared (or, a layer of silicon nitride may be prepared first, and then a layer of polymer material is prepared), so that the production process is simple, and the time and cost may be saved. Then, the composite film is laminated with the organic light-emitting diode on which a polymer material has been formed, and a nano stamping press is preferably employed for lamination, the pressure is preferably 500 psi, and the temperature is preferably 80° C. (which cannot be higher than the glass transition temperature Tg of any material in the organic light-emitting diode), and the stamping time is preferably 30 minutes, so that the azido group in the compound of Formula I is activated to react with the active hydrogen atom of the polymer on the surface of the organic light-emitting diode so as to form a covalent bond.

According to one embodiment of the packaging method of the present disclosure, the —$N_3$ group in the compound of Formula I is activated by stamping, heating and ultraviolet irradiation.

Different manners for activating the —$N_3$ group may be selected according to the device structures, for example, the —$N_3$ group may be activated by stamping and heating, or ultraviolet light may be employed for activating the azides. When the organic light-emitting diode has a bottom emission structure, the azido group may be activated by stamping or heating or ultraviolet light irradiation; otherwise, when the organic light-emitting diode has a top emission structure, the azido group may be activated only by stamping or heating.

In conclusion, the composite film and the method for manufacturing the same, and the organic light-emitting diode and the method for manufacturing the same according to the present disclosure involve a plurality of factors, and different embodiments may be combined according to the claims. Therefore, the embodiments are only provided for illustrating the present disclosure, rather than limiting the present disclosure. The present disclosure will be further illustrated below in conjunction with Embodiments 1-6, which are embodiments related to the method for manufacturing a composite film.

Embodiment 1

In Embodiment 1 of the method for manufacturing a composite film according to the present disclosure, a PET membrane is employed as a base membrane, and first of all, a base membrane pretreatment step is carried out which includes irradiating a first surface of the base membrane with oxygen plasma to generate negative oxygen ions on the first surface of the base membrane; and then, an electrostatic deposition step is carried out which includes placing the pretreated PET membrane in a PDDA electrolyte solution for deposition, and placing the PET membrane deposited with a PDDA layer in a graphite oxide dispersion for deposition, and repeating the above deposition operations until three PDDA layers and three graphite oxide layers are deposited on the base membrane, with the graphite oxide layer as a layer deposited last; and finally, a self-assembling step is carried out which includes placing and soaking the PET membrane deposited with a graphite oxide layer in a solution of a compound of Formula I, and self-assembling the compound of Formula I on the graphite oxide layer, wherein the solution of the compound of Formula I is a methanol solution with a concentration of 3 mg/ml, and the soaking time is 90 min, hereto, the self-assembling step is ended, and the manufacture of the composite film is completed.

Embodiment 2

In Embodiment 2 of the method for manufacturing a composite film according to the present disclosure, the base membrane is a PET membrane, and first of all, a base membrane pretreatment step is carried out which includes irradiating a first surface of the PET membrane with oxygen plasma to generate negative oxygen ions on the first surface of the base membrane; and then, an electrostatic deposition step is carried out which includes placing the pretreated PET membrane in a PDDA electrolyte solution for deposition, and placing the PET membrane deposited with a PDDA layer in a graphite oxide dispersion for deposition, and repeating the above deposition operations until four PDDA layers and four graphite oxide layers are deposited on the base membrane, with the graphite oxide layer as a layer deposited last; and finally, a self-assembling step is carried out which includes placing and soaking the PET membrane deposited with a graphite oxide layer in a solution of a compound of Formula I, and self-assembling the compound of Formula I on the graphite oxide layer, wherein the solution of the compound of Formula I is a methanol solution with a concentration of 5 mg/ml, and the soaking time is 150 min, hereto, the self-assembling step is ended, and the manufacture of the composite film is completed.

Embodiment 3

In Embodiment 3 of the method for manufacturing a composite film according to the present disclosure, the base membrane is a PET membrane, and first of all, a base membrane pretreatment step is carried out which includes irradiating a first surface of the PET membrane with oxygen plasma to generate negative oxygen ions on the first surface of the base membrane; and then, an electrostatic deposition step is carried out which includes placing the pretreated PET membrane in a PDDA electrolyte solution for deposition, and placing the PET membrane deposited with a PDDA layer in a graphite oxide dispersion for deposition, and repeating the above deposition operations until five PDDA layers and five graphite oxide layers are deposited on the base membrane, with the graphite oxide layer as a layer deposited last; and finally, a self-assembling step is carried out which includes placing and soaking the PET membrane deposited with a graphite oxide layer in a solution of a compound of Formula I, and self-assembling the compound of Formula I on the graphite oxide layer, wherein the solution of the compound of Formula I is a methanol solution with a concentration of 4 mg/ml, and the soaking time is 100 min, hereto, the self-assembling step is ended, and the preparation of the composite film is completed.

Embodiment 4

In Embodiment 4 of the method for manufacturing a composite film according to the present disclosure, the base membrane is a PET membrane, and first of all, a base membrane pretreatment step is carried out which includes irradiating a first surface of the PET membrane with oxygen plasma to generate negative oxygen ions on the first surface of the base membrane; and then, an electrostatic deposition step is carried out which includes placing the pretreated PET membrane in a PDDA electrolyte solution for deposition, and placing the PET membrane deposited with a PDDA layer in a graphite oxide dispersion for deposition, and repeating the above deposition operations until six PDDA layers and six graphite oxide layers are deposited on the base membrane, with the graphite oxide layer as a layer deposited last; and finally, a self-assembling step is carried out which includes placing and soaking the PET membrane deposited with a graphite oxide layer in a solution of a compound of Formula I, and self-assembling the compound of Formula I on the graphite oxide layer, wherein the solution of the compound of Formula I is a methanol solution with a concentration of 4 mg/ml, and the soaking time is 120 min, hereto, the self-assembling step is ended, and the preparation of the composite film is completed.

Embodiment 5

In Embodiment 5 of the method for manufacturing a composite film according to the present disclosure, first of all, an electrode preparation step is carried out which includes preparing, on a second surface of the base membrane, an emitting electrode and a receiving electrode that are configured for a touch screen; then, a base membrane pretreatment step is carried out which includes irradiating a first surface of the base membrane with oxygen plasma to generate negative oxygen ions on the first surface of the base membrane; and then, an electrostatic deposition step is carried out which includes placing the pretreated PET membrane in a PDDA electrolyte solution for deposition, and placing the PET membrane deposited with a PDDA layer in a graphite oxide dispersion for deposition, and repeating the above deposition operations until four PDDA layers and four graphite oxide layers are deposited on the base membrane, with the graphite oxide layer as a layer deposited last; and finally, a self-assembling step is carried out which includes placing and soaking the PET membrane deposited with a graphite oxide layer in a solution of a compound of Formula I, and self-assembling the compound of Formula I on the graphite oxide layer, wherein the solution of the compound of Formula I is a methanol solution with a concentration of 4 mg/ml , and the soaking time is 100 min, hereto, the self-assembling step is ended, and the preparation of the composite film is completed.

Embodiment 6

In Embodiment 6 of the method for manufacturing a composite film according to the present disclosure, first of all, an electrode preparation step is carried out which includes preparing, on a second surface of the base membrane, an emitting electrode and a receiving electrode that are configured for a touch screen; then, a base membrane pretreatment step is carried out which includes irradiating a first surface of the base membrane with oxygen plasma to generate negative oxygen ions on the first surface of the base membrane; an electrostatic deposition step is carried out which includes placing the pretreated PET membrane in a PDDA electrolyte solution for deposition, and placing the PET membrane deposited with a PDDA layer in a graphite oxide dispersion for deposition, and repeating the above deposition operations until six PDDA layers and six graphite oxide layers are deposited on the base membrane, with the graphite oxide layer as a layer deposited last; and finally, a self-assembling step is carried out which includes placing and soaking the PET membrane deposited with a graphite oxide layer in a solution of a compound of Formula I, and self-assembling the compound of Formula I on the graphite oxide layer, wherein the solution of the compound of Formula I is a methanol solution with a concentration of 3 mg/ml, and the soaking time is 130 min, hereto, the self-assembling step is ended, and the preparation of the composite film is completed.

In each of Embodiments 1-4, a composite film for packaging an organic light-emitting diode deposited with a polymer containing an active hydrogen atom is prepared; and in each of Embodiments 5-6, a film that may be used for packaging an organic light-emitting diode deposited with a polymer containing an active hydrogen atom is prepared, and the other surface thereof after being packaged may be configured for integrating a touch display screen.

According to the method for packaging an organic light-emitting diode according to the present disclosure, the composite film prepared in Embodiments 1-4 is used for packaging a light-emitting diode. According to one embodiment of the present disclosure, the packaging method includes: a polymer deposition step which includes depositing a layer of polymer containing an active hydrogen atom on the surface of an organic light-emitting diode; and a packaging step which includes laminating the composite film prepared in Embodiments 1-6 and the organic light-emitting diode, and activating the —$N_3$ group in the compound of Formula I via stamping, heating and ultraviolet irradiation to form a covalent bond between the —$N_3$ group and the active hydrogen atom, thereby realizing packaging.

The composite film prepared by the manufacturing method according to the present disclosure is employed for packaging an organic light-emitting diode. In this way, it may be realized that the organic light-emitting diode and the composite film are prepared seperately, thus the production steps may be reduced, the production cost may be decreased, and it is easy to realize industrialization, moreover, the problem of the traditional method may be solved that the performance of an organic light-emitting diode is damaged by placing the organic light-emitting diode in a solution for film deposition during the packaging of the diode; when the composite film of the present disclosure is employed for packaging, the transmittance may be above 90%; moreover, when the organic light-emitting diode is packaged by the composite film of the present disclosure, the graphite oxide and the polymer layer are chemically connected via a monomolecular layer, thus the bonding will be firmer, and meanwhile the water and oxygen resistance will be improved.

Figure 8:
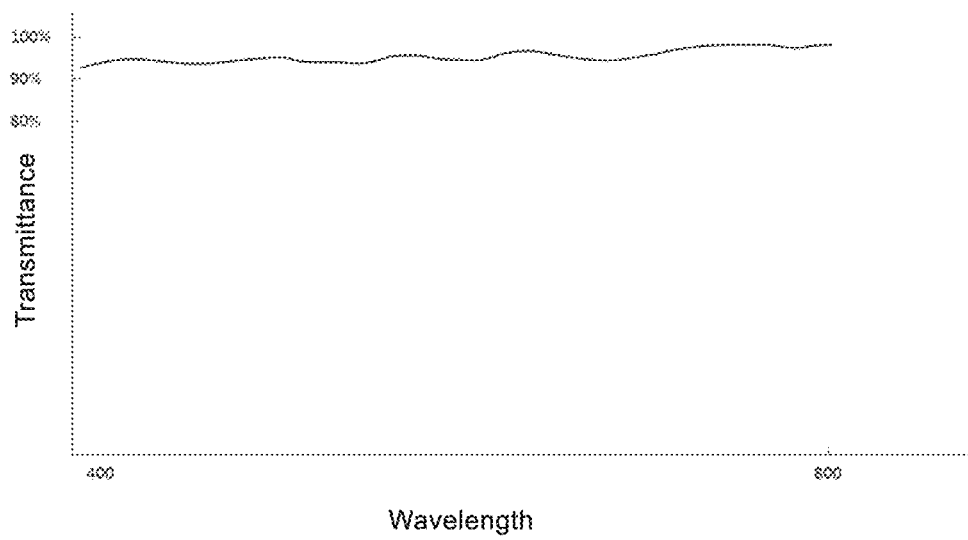
FIG. 8 shows the transmittance curve of a light-emitting diode packaged by the composite film manufactured according to embodiment 1.

The transmittance of the composite film prepared according to Embodiment 1 (with a film thickness of about 250 μm) is tested by the inventors via a spectrophotometer, and the test result is as shown in FIG. 8. It may be seen from FIG. 8 that, the transmittances of the film tested under different wavelengths are all above 90%.

Figure 9:
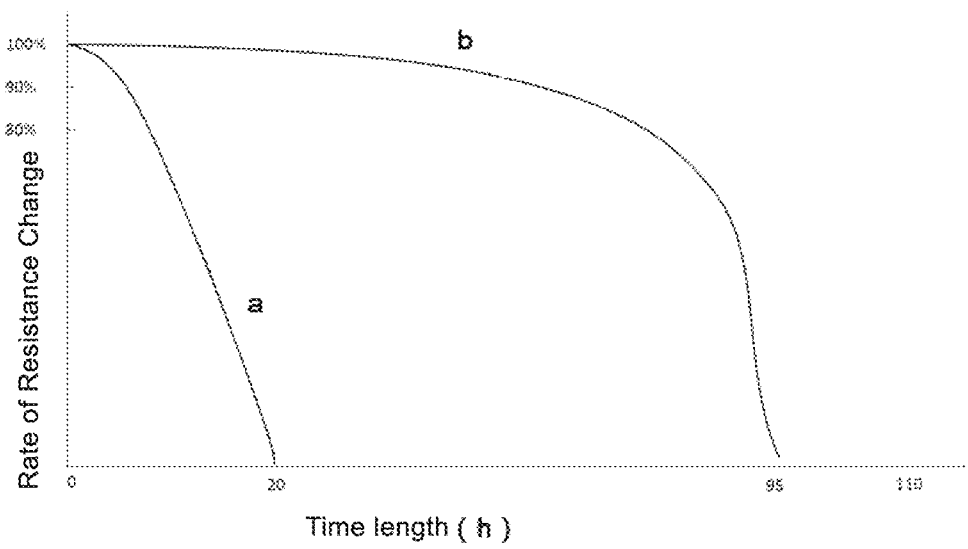
FIG. 9 shows water and oxygen transmittance curves of a light-emitting diode packaged by the composite film prepared according to embodiment 1 and a light-emitting diode packaged by a PET membrane.

Water and oxygen transmittances of the composite film prepared according to Embodiment 1 (with a film thickness of about 250 μm) and a PET membrane are detected by the inventors via a calcium mirror method, that is, the film is fixed on a calcium mirror testing apparatus via an epoxy resin glue, and the change of calcium resistance is tested in a aqueous vapour and oxygen gas environment; the faster the resistance changes, the faster the calcium is corroded, and the worse the packaging effect will be. The test result is as shown in FIG. 9, wherein R represents the initial resistance of the light-emitting diode, R' represents the resistance of the light-emitting diode passing through water and oxygen, R/R' represents the rate of resistance change, curve a represents the water and oxygen transmittance curve of the PET membrane, and curve b represents the water and oxygen transmittance curve of the composite film prepared according to Embodiment 1. It may be seen from FIG. 9 that, for curve a, R' increases sharply within 20 hours, but for curve b, the resistance changes little within 90 hours; therefore, it may be seen that the composite film prepared according to Embodiment 1 has good water and oxygen resistance, and the packaging effect is excellent.

Figure 10:
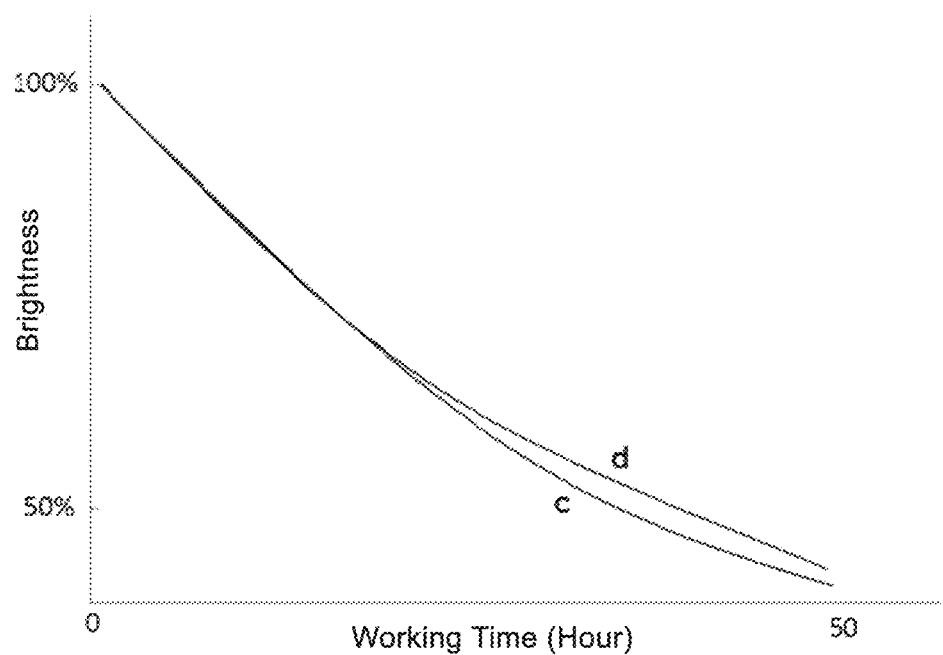
FIG. 10 shows brightness decay curves of a light-emitting diode packaged by the composite film prepared according to embodiment 1 and an organic light-emitting diode packaged by a cover glass.

A brightness decay test is performed by the inventors on a light-emitting diode packaged with the composite film prepared according to Embodiment 1 (with a film thickness of about 250 μm) and on a light-emitting diode packaged with a cover glass, and the test result is as shown in FIG. 10, wherein curve c represents the brightness decay curve of the light-emitting diode packaged with a cover glass, and curve d represents the brightness decay curve of the light-emitting diode packaged with the composite film prepared according to Embodiment 1. It may be seen from FIG. 10 that, the brightness decay speed of the light-emitting diode packaged with the composite film prepared according to Embodiment 1 is slightly slower than the brightness decay speed of the light-emitting diode packaged with a cover glass.

Apparently, various modifications and variations may be made to the present disclosure by one skilled in the art without departing from the spirit and scope of the present disclosure. Thus, if these modifications and variations of the present disclosure pertain to the scope of the claims of the present disclosure and their equivalents, the present disclosure intends to encompass these modifications and variations.

What is claimed is:

1. A composite film, comprising:
a base membrane;
a phthalic diglycol diacrylate (PDDA) layer, which is deposited on a first surface of the base membrane;
a graphite oxide layer, which is deposited on the PDDA layer;
a monomolecular layer, which is self-assembled on a surface of the graphite oxide layer and is composed of a compound of Formula 1;

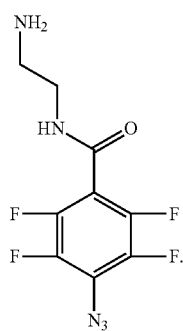

Formula I

2. The composite film according to claim 1, wherein the monomolecular layer is connected with the graphite oxide layer via a hydrogen bond.

3. The composite film according to claim 2, wherein the hydrogen bond is generated by —NH₂ in the compound of Formula I and —COOH and/or —OH on the surface of the graphite oxide layer.

4. The composite film according to claim 1, wherein the base membrane is a polyethylene terephthalate (PET) membrane.

5. The composite film according to claim 4, comprising at least three PDDA layers and at least three graphite oxide layers;
wherein the PDDA layers and the graphite oxide layers are deposited alternately, with the graphite oxide layer as a layer deposited last.

6. The composite film according to claim 5, wherein a second surface of the base membrane is provided with an emitting electrode and a receiving electrode that are configured for a touch screen.

7. A method for manufacturing a composite film, comprising a self-assembling step of:
placing and soaking a base membrane deposited with a graphite oxide layer in a solution of a compound of Formula I, and self-assembling the compound of Formula I on the graphite oxide layer;

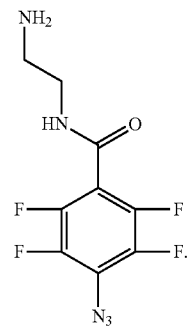

Formula I

8. The manufacturing method according to claim 7, wherein the solution of the compound of Formula I is a methanol solution with a concentration of 3~5 mg/ml.

9. The manufacturing method according to claim 7, wherein a soaking time is 90~150 min.

10. The manufacturing method according to claim 7, wherein the base membrane deposited with the graphite oxide layer is prepared by a base membrane pretreatment step and an electrostatic deposition step.

11. The manufacturing method according to claim 10, wherein the base membrane pretreatment step comprises irradiating a first surface of the base membrane with oxygen plasma, and generating negative oxygen ions on the first surface of the base membrane.

12. The manufacturing method according to claim 11, wherein the electrostatic deposition step comprises:
placing a pretreated base membrane in a phthalic diglycol diacrylate (PDDA) electrolyte solution for deposition, and then placing it in a graphite oxide dispersion for deposition;
repeating the above deposition operations, until at least three PDDA layers and three graphite oxide layers are deposited on the base membrane, with the graphite oxide layer as a layer deposited last.

13. The manufacturing method according to claim 10, wherein the method comprises an electrode preparation step before the base membrane pretreatment step, the electrode preparation step comprises preparing, on a second surface of the base membrane, an emitting electrode and a receiving electrode that are configured for a touch screen.

14. An organic light-emitting diode, packaged by the composite film according to claim 1.

15. The organic light-emitting diode according to claim 14, wherein a layer of polymer is deposited on a surface of the organic light-emitting diode before packaging.

16. The organic light-emitting diode according to claim 15, wherein the polymer contains an active hydrogen atom which forms a covalent bond with —$N_3$ of the compound of Formula I.

17. A method for packaging an organic light-emitting diode, comprising:
   a polymer deposition step which comprises depositing a layer of polymer containing an active hydrogen atom on a surface of an organic light-emitting diode; and
   a packaging step which comprises laminating the composite film of claim 1 and the organic light-emitting diode, activating the —$N_3$ group of the compound of Formula I to form a covalent bond between the —$N_3$ group and the active hydrogen atom, thereby realizing packaging.

18. The packaging method according to claim 17, wherein the —$N_3$ group in the compound of Formula I is activated by stamping, heating and ultraviolet irradiation.

19. A method for packaging an organic light-emitting diode, comprising:
   a polymer deposition step which comprises depositing a layer of polymer containing an active hydrogen atom on the surface of an organic light-emitting diode; and
   a packaging step which comprises preparing a composite film using the method for manufacturing a composite film according to claim 7, laminating the composite film and the organic light-emitting diode, and activating the —$N_3$ group in the compound of Formula I to form a covalent bond between the —$N_3$ group and the active hydrogen atom, thereby realizing packaging.

20. The packaging method according to claim 19, wherein the —$N_3$ group in the compound of Formula I is activated by stamping, heating and ultraviolet irradiation.

* * * * *